(12) United States Patent
Chen et al.

(10) Patent No.: US 8,216,679 B2
(45) Date of Patent: Jul. 10, 2012

(54) GLAZING SYSTEM FOR VEHICLE TOPS AND WINDOWS

(75) Inventors: Meng Chen, Novi, MI (US); Steven M. Gasworth, Novi, MI (US); Sunitha Grandhee, Novi, MI (US); Johnathan Ross Sargent, Kingston (CA)

(73) Assignee: Exatec LLC, Wixom, MI (US)

( * ) Notice: Subject to any disclaimer, the term of this patent is extended or adjusted under 35 U.S.C. 154(b) by 705 days.

(21) Appl. No.: 11/376,999

(22) Filed: Mar. 16, 2006

(65) Prior Publication Data

US 2007/0026235 A1    Feb. 1, 2007

Related U.S. Application Data

(60) Provisional application No. 60/702,932, filed on Jul. 27, 2005.

(51) Int. Cl.
*B32B 27/28* (2006.01)
*B32B 27/36* (2006.01)

(52) U.S. Cl. ......... 428/412; 428/447; 428/448; 428/480

(58) Field of Classification Search ............... 428/412, 428/447, 448, 480
See application file for complete search history.

(56) References Cited

U.S. PATENT DOCUMENTS

| | | | | |
|---|---|---|---|---|
| 4,159,206 A | * | 6/1979 | Armbruster et al. | 106/287.12 |
| 4,396,678 A | * | 8/1983 | Olson | 428/412 |
| 4,806,412 A | * | 2/1989 | Wank et al. | 428/203 |
| 5,156,882 A | * | 10/1992 | Rzad et al. | 427/489 |
| 6,110,544 A | * | 8/2000 | Yang et al. | 427/580 |
| 6,136,441 A | * | 10/2000 | MacGregor et al. | 428/412 |
| 6,261,694 B1 | * | 7/2001 | Iacovangelo | 428/412 |
| 7,595,097 B2 | | 9/2009 | Iacovangelo et al. | |
| 7,703,413 B2 | | 4/2010 | Miebach et al. | |
| 7,732,041 B2 | | 6/2010 | Grandhee et al. | |
| 2002/0110695 A1 | * | 8/2002 | Yang et al. | 428/447 |
| 2004/0071971 A1 | * | 4/2004 | Iacovangelo | 428/412 |

FOREIGN PATENT DOCUMENTS

| | | |
|---|---|---|
| EP | 0 887 433 A1 | 12/1998 |
| JP | 2001315271 A | 11/2001 |
| WO | WO 00/55654 | 9/2000 |
| WO | WO 00/55656 | 9/2000 |
| WO | WO 03/078162 A1 | 9/2003 |

OTHER PUBLICATIONS

International Search Report; International Application No. PCT/US2006/024022; International Filing Date: Jun. 21, 2006; 2 Pages.
Written Opinion of the International Search Report; International Application No. PCT/US2006/024022; International Filing Date: Jun. 21, 2006; 5 Pages.
Japanese Patent No. 2001315271 (A); Publication Date: Nov. 13, 2001; Abstract Only; 1 Page.
Japanese Patent No. 2001315271 (A); Publication Date: Nov. 13, 2001; Machine Translation; 24 Pages.
Pickett et al., "Highly Predictive Accelerated Weathering of Engineering Thermoplastics" SAE Technical Paper Series No. 2003-01-1192; 2003; 7 pages.

* cited by examiner

*Primary Examiner* — Callie Shosho
*Assistant Examiner* — John Freeman
(74) *Attorney, Agent, or Firm* — Cantor Colburn LLP

(57) ABSTRACT

A glazing system and method for vehicle tops and windows is described therein. The system includes a panel having a top side and a bottom side, a first protective coating deposited on the top side and second protective coating deposited on the bottom side. The protective coatings provide protection from weathering and abrasion.

15 Claims, 3 Drawing Sheets

GLAZING SYSTEM FOR VEHICLE TOPS AND WINDOWS

RELATED APPLICATION

This application claims the benefit of U.S. provisional application entitled GLAZING SYSTEM FOR VEHICLE TOPS AND WINDOWS, application No. 60/702,932 filed on Jul. 27, 2005, the entirety of which is hereby incorporated by reference.

BACKGROUND

1. Field of the Invention

The present invention generally relates to glazing assemblies for vehicle tops and windows.

2. Description of the Known Technology

Plastic materials, such as polycarbonate (PC) and polymethylmethyacrylate (PMMA), are currently being used in the manufacturing of numerous automotive parts and components, such as B-pillars, headlamps, and sunroofs. Automotive vehicle tops and window modules represent an emerging application for these plastic materials because of various advantages in the areas of styling/design, weight savings, and safety. More specifically, plastic materials offer the automotive manufacturer the ability to reduce the complexity of the vehicle top and window assemblies through the integration of functional components into the molded plastic module, as well as to distinguish their vehicle from a competitor's vehicle by increasing overall design and shape complexity. The use of light weight plastic window and vehicle top modules may facilitate both a lower center of gravity for the vehicle (better vehicle handling and safety) and improved fuel economy. Finally, enhanced safety is further recognized through a greater propensity for occupant or passenger retention within a vehicle having plastic window and vehicle top modules when involved in a roll-over accident.

Although many advantages associated with implementing plastic vehicle tops and windows are recognized, these plastic modules will not see wide scale commercial utilization until existing regulations (e.g., Title 49, Chapter 5, Part 571.205 of the Federal Motor Vehicle Standard No. 205; ANS1-Z26.1 American National Standards Institute—1977) and various original equipment manufacturer (OEM) specifications, as established for glass windows, are met. In order to meet these requirements, protective layers (e.g., coatings or films) must be applied to the plastic window or vehicle top to overcome several limitations exhibited by plastic materials. These limitations include degradation caused by exposure to ultraviolet (UV) radiation, as exemplified by a color change, decreased optical transmission, and enhanced embrittlement (decrease in impact resistance), as well as both limited abrasion resistance and hydrolytic stability. Premature failure of the protective layer system, as indicated by delamination or adhesion loss, will result in a limited lifetime for the plastic window or vehicle top via the acceleration of the aforementioned degradation mechanisms. A darkening in the color or tint of the plastic window or vehicle top, for example, transparent clear (no tint)<solar (green tint)<privacy (dark tint), can facilitate premature failure of the protective layer system, presumably through an increase in the temperature at the interface between the plastic window or vehicle top and the protective layer system during environmental exposure. Since the weathering layer may be of different thickness (and therefore a variation in ultraviolet absorber (UVA) concentration) over the entire plastic window, premature failure is also observed where the weathering layer is thin (low UVA concentration). This same argument can be applied to the failure mechanism observed for other coated opaque plastic components (e.g., molding, B-pillars, tailgate modules, body panels, etc.) of various colors.

Therefore, there exists a need for a glazing assembly that will meet automotive regulatory and OEM requirements for windows and vehicle tops, as well as be robust against the occurrence of premature failure.

SUMMARY

In overcoming the drawbacks and limitations of the known technologies, a glazing assembly and method of application for vehicle tops and windows is disclosed. The glazing assembly includes a panel having a top side and a bottom side, a first protective coating system deposited on the top side and second protective coating system deposited on the bottom side. The protective coating systems provide the panel with protection from weathering, abrasion, or both. Additionally, a decorative ink layer may be disposed between the transparent panel and the second protective coating.

As to the method of application, the method includes the steps of providing a panel having a top side and a bottom side, preheating the surface of the bottom side, depositing a first abrasion resistant layer to the bottom side using a reactive reagent in a PECVD process. In one embodiment an arc-PECVD process is utilized wherein the surface of the bottom side of the panel is preheated to approximately 40-50° C. The first abrasion resistant layer is deposited on the bottom side of the panel using a reactive reagent, a first arc current less than about 60 amps/arc, a first reactive reagent flow rate of less than about 170 sccm/arc, and an oxygen flow rate less than about 400 sccm/arc; further depositing a second abrasion resistant layer to the bottom side using a second arc current less than about 60 amps/arc, a second reactive reagent flow rate of less than about 170 sccm/arc, and an oxygen flow rate less than about 950 sccm/arc.

These and other aspects and advantages of the present invention will become apparent upon reading the following detailed description of the invention in combination with the accompanying drawings.

DETAILED DESCRIPTION

The use of gaseous, reactive reagents in a vacuum deposition process to form an adherent and weatherable primer (e.g. for the subsequent deposition of an abrasion-resistant top layer) can provide significant protection to the underlying plastic panel from UV radiation and other environmental factors. Using this primer as an interlayer between plastic (or a coated plastic) and an abrasion-resistant layer, has been found to allow the primer to act as an adherent and a weatherable primer for a vacuum deposited abrasion-resistant layer.

The weatherability of such a layer can be calculated assuming failure of the protective coating system is dependent on the lifetime and loading of the ultraviolet absorbing species present in the coating system; thus, one can predict the lifetime of the glazing assembly. A theory well known to those skilled in the art of weatherable coatings is that the total dose of UV radiation that is not screened by the coating system is what will mediate failure. Plastics are particularly sensitive to a wavelength range in the UV light region of the electromagnetic spectrum that is centered around 330 nm. It is known that an uncoated plastic panel, such as polycarbonate, will yellow by greater than about 5 Yellow Index units after exposure to about 3 MegaJoules (MJ) of UV light at 325 nm. A change in 5 Yellow Index units is highly visible to the human eye and is considered as a weathering failure. Therefore when about 3 MJ at 325 nm of UV light is allowed through a coating system, failure should occur in a coated panel. The yellowness index is known to those skilled in the art and is defined within both ASTM E313-73 and ASTM D1925-70 standard test protocols.

Once the UVA decay rate is known, the initial absorption of the UVA, and the known time to failure in terms of a change in YI greater than +5 can be modeled using Equation 1. In this equation, R is the rate of decay, $A_o$ is the initial absorbance, and $t_f$ is the required exposure (in MegaJoules) to cause failure of the uncoated plastic sample.

$$MJ(\text{until failure of coated panel}) = \frac{1}{R}\log\left(\frac{10^{Rt_f} + 10^{-A_o} - 1}{10^{-A_o}}\right) \quad \text{Eq. 1}$$

The decay rate for many conventional coatings is approximately 0.1 UV absorption units per MegaJoules (ABS/MJ) at 325 nm In such a case, the increase in lifetime of a PC panel coated with 1 micron of a protective coating comprising an UV absorbing species (0.14 ABS at 325 nm) can be calculated to be about 30%. If the decay rate is 10 times higher at about 1 ABS/MJ at 325 nm, then the increase in lifetime would be only about 8%, and if it is 10 times lower, about 0.01 ABS/MJ at 325 nm, then the increase in lifetime would be about 40%.

Figure 1:
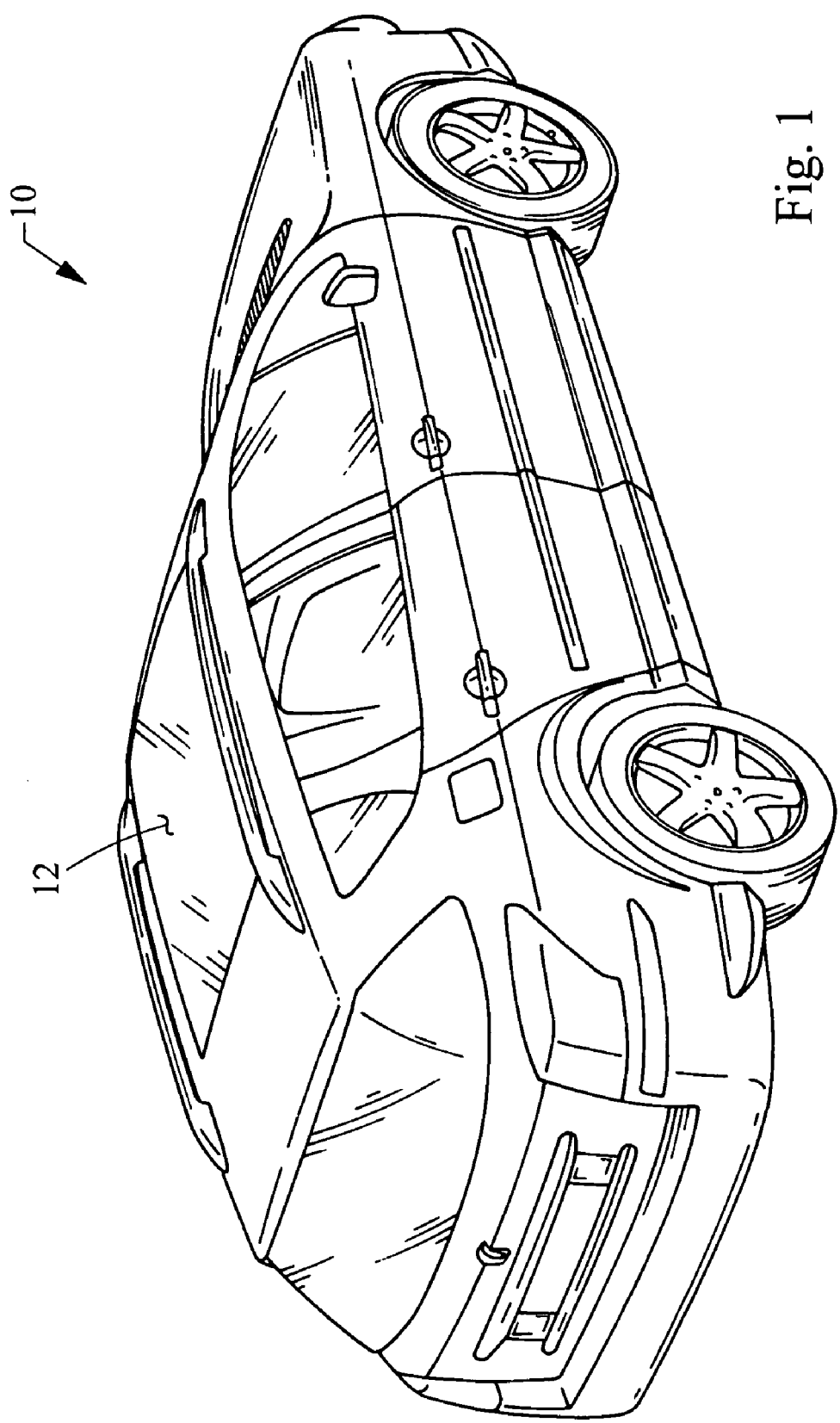
FIG. 1 is a perspective view of an automobile having a glazing assembly embodying the principles of the present invention.
Figure 2:
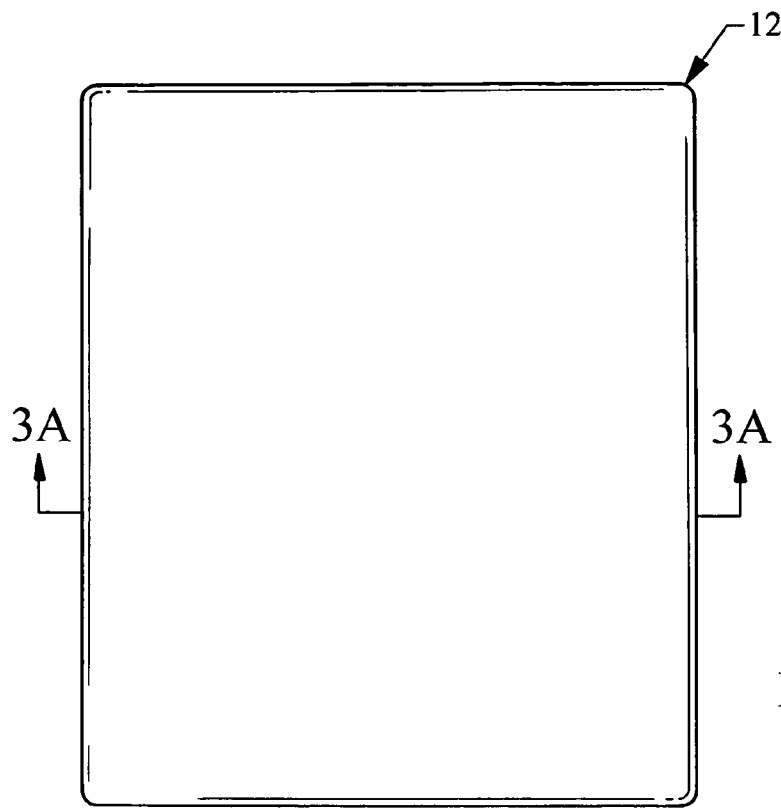
FIG. 2 is a top view of the glazing assembly shown in FIG. 1.

Referring to FIG. 1, an automobile 10 incorporating the present invention is shown therein. The automobile 10 includes a glazing assembly 12 mounted to the automobile 10. This embodiment shows the glazing assembly 12 functioning as a sunroof for the automobile 10. However, the glazing assembly 12 may be appropriately located and dimensioned so as to function as a rear window, a side window, a windshield, or a body panel for the automobile 10. Referring to FIG. 2, a more detailed view of the automotive glazing assembly 12 is shown. As shown therein, the glazing assembly 12 is transparent. However, the glazing assembly 12 may be opaque when desired, such as may be the case when functioning as a body panel.

Figure 3A:
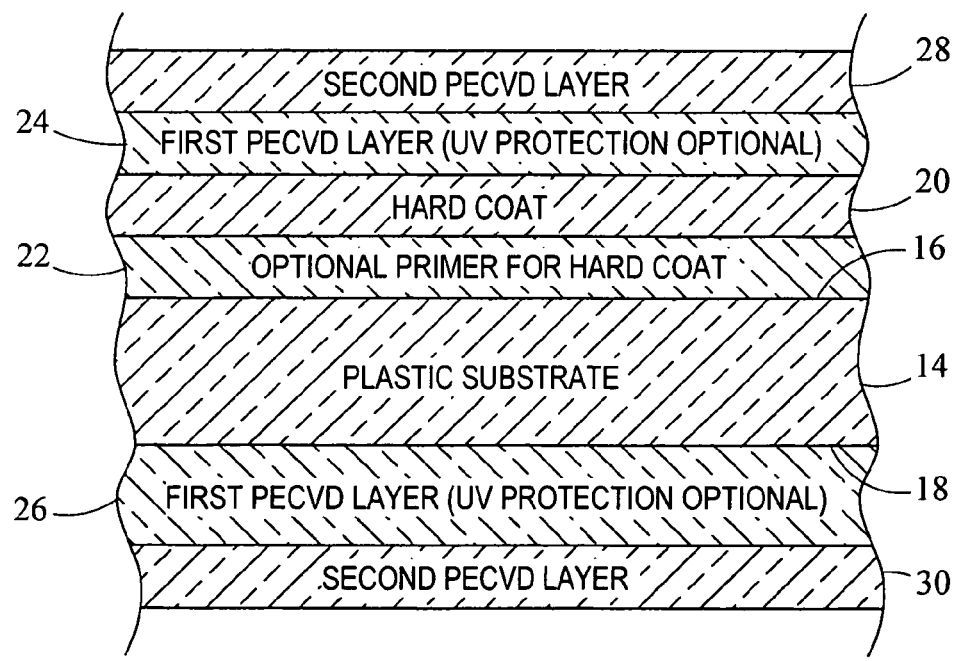
FIG. 3A is a cross sectional view of a portion of the glazing assembly generally taken along lines 3A-3A of FIG. 2.

Referring to FIG. 3A, a cross section of one embodiment of the automotive glazing assembly 12 is shown. The glazing assembly 12 includes a plastic panel 14 having a top side 16 and a bottom side 18. The plastic panel 14 may be comprised of any thermoplastic or thermoset polymeric resin. The plastic panel 14 should be substantially transparent, but may contain opaque regions, such as but not limited to an opaque frame or border. The polymeric resins may include, but are not limited to, polycarbonate, acrylic, polyarylate polyester, polysulfone, polyurethane, silicone, epoxy, polyamide, polyalkylenes, and acrylonitrile-butadiene-styrene (ABS), as well as copolymers, blends, and mixtures thereof. The preferred transparent, thermoplastic resins include, but are not limited to, polycarbonate, acrylic, polyarylate, polyester, and polysulfone, as well as copolymers and mixtures thereof. The plastic panel may further include various additives, such as colorants, rheological control agents, mold release agents, antioxidants, UVA molecules, and IR absorbing or reflecting pigments, among others. The plastic panels may be formed through the use of any known technique to those skilled in the art, such as extrusion, molding, which includes injection molding, blow molding, and compression molding, or thermoforming, which includes thermal forming, vacuum forming, and cold forming.

Placed on the top side 16 of the plastic panel 14 is a first protective coating system comprising a weathering layer 20 and abrasion-resistant layers 24, 28. An optional primer layer 22 aids in adhering the weathering layer 20 to the top side 16 of the plastic panel 14. The weathering layer 20 may include, but is not limited to, silicones, polyurethanes, acrylics, polyesters, epoxies, and mixtures or copolymers thereof. The weathering layer 20 may be extruded or cast as thin films or applied as a discrete coating. The weathering layer 20 may comprise multiple coating interlayers, such as an acrylic primer and silicone hard-coat or a polyurethane coating, in order to enhance the protection of the plastic panel. One specific example of the weathering layer 20 comprising multiple coating interlayers include a combination of an acrylic primer (SHP401, GE Silicones, Waterford, N.Y.) and a silicone hard-coat (AS4000, GE Silicones). A variety of additives may be added to the weathering layer 20, such as colorants (tints), rheological control agents, mold release agents, antioxidants, ultraviolet absorbing (UVA) molecules, and IR absorbing or reflecting pigments, among others. The coatings that comprise the weathering layer 20 may be applied by dip coating, flow coating, spray coating, curtain coating, or other techniques known to those skilled in the art.

Placed on the bottom side 18 of the plastic panel 14 is a second protective coating system comprising multiple abrasion-resistant layers 26, 30. The abrasion-resistant layers 24, 26 are applied on both the top and bottom sides 16, 18 of the panel, respectively. One or both abrasion-resistant layers 24, 26 may contain UV blocking additives. Additional abrasion-resistant layers 28, 30 may then be applied to the initial abrasion-resistant layers 24, 26, respectively. Another embodiment of the present invention provides a weathering layer on the bottom side of the plastic panel, as well as on the top side of the plastic panel prior to the deposition of the abrasion-resistant layers.

The abrasion-resistant layers 24, 26 may be substantially similar or different in overall composition. Similarly, abrasion-resistant layers 28, 30 may also be substantially similar or different in overall composition. When abrasion-resistant layers 24, 28 and abrasion-resistant layers 26, 30 are substantially similar in composition, they preferably do not comprise any UV absorbing molecules and may be considered as forming a single (e.g., thick) abrasion-resistant layer. The abrasion-resistant layers 24, 26, 28, 30, may be applied by any vacuum deposition technique known to those skilled in the art, including but not limited to plasma enhanced chemical vapor deposition (PECVD), ion assisted plasma deposition, magnetron sputtering, electron beam evaporation, and ion beam sputtering with PECVD being preferred.

The inventors have surprisingly found that abrasion-resistant layers 24, 26 of different composition may be simultaneously applied to the top and bottom sides 16, 18 of the panel, respectively. In another embodiment the abrasion-resistant layers 24, 26 may also be applied to the panel in a sequential manner. Similarly, abrasion-resistant layers 28, 30 of different composition may also be applied to the surface of the abrasion-resistant layers 24, 26 either simultaneously or sequentially.

In one embodiment of the present invention a specific type of PECVD process comprising an expanding thermal plasma reactor is utilized. This specific process (called hereafter as an arc-PECVD process) is described in detail in U.S. patent application Ser. No. 10/881,949 (filed Jun. 28, 2004) and U.S. patent application Ser. No. 11/075,343 (filed Mar. 8, 2005) which are hereby incorporated by reference. In an arc-PECVD process, a plasma is generated via applying a direct-current (DC) voltage to a cathode that arcs to a corresponding anode plate in an inert gas environment at pressures higher than 150 Torr, e.g., near atmospheric pressure. The near atmospheric thermal plasma then supersonically expands into a plasma treatment chamber in which the process pressure is less than that in the plasma generator, e.g., about 20 to about 100 mTorr.

The reactive reagent for the PECVD process may comprise, for example, octamethylcyclotetrasiloxane (D4), tetramethyldisiloxane (TMDSO), hexamethyldisiloxane (HMDSO), or another volatile organosilicon compound. The organosilicon compounds are oxidized, decomposed, and polymerized in the arc plasma deposition equipment, typically in the presence of oxygen and an inert carrier gas, such as argon, to form an abrasion resistant layer. The composition of the resulting abrasion layer may vary from $SiO_x$ to $SiO_x$-$C_yH_z$ depending upon the amount of carbon and hydrogen atoms that remain in the deposited coating. Materials suitable for the abrasion-resistant layer include silicon monoxide, silicon dioxide, silicon oxycarbide, and hydrogenated silicon oxycarbide, among others, as well as mixtures thereof.

The inventors have found that two plasma recipes (A & B) deposit coatings that exhibit the desired performance with respect to meeting the existing regulations (e.g., Title 49, Chapter 5, Part 571.205 of the Federal Motor Vehicle Standard No. 205; ANS1-Z26.1 American National Standards Institute—1977) and many OEM specifications. More specifically, the abrasion resistant layers 24, 26, 28, 30 resulting from the two plasma recipes were found to pass tests pertaining to abrasion-resistance, water immersion adhesion, interior weatherability (Cira/Sodalime test), thermal-mechanical strength (thermal-cycling test of 14 cycles), adhesive bonding strength (cataplasma test), and chemical resistance, among others. All of the described tests are known to those skilled in the art of manufacturing automotive windows. The Cira/Sodalime weathering test is fully described in *SAE Congress Proceedings* Paper #2003-01-1192 and *Federation of Societies for Coatings Technology* (*FSCT*), 93-106 (2005). A plasma recipe refers to the operating conditions, such as pre-heat temperature, gas flow rate, and arc electrical current, utilized to produce and control the reactive species present during the arc-PECVD process.

Both plasma recipes comprise the deposition of at least two abrasion resistant layers (e.g., the first layers 24, 26 and the second layers 28, 30) on both the top side 16 and the bottom side 18 of the plastic panel 14. The surface of the bottom side 18 of the plastic panel 14 is preheated to about 40-50° C., while the surface of the top side 16 of the plastic panel 14 is preheated to about 50-60° C. The deposition of the abrasion resistant layers on the bottom side 18 and the top side 16 of the plastic panel 14 for both plasma recipes utilizes an arc current less than about 60 amps/arc, a reactive reagent flow rate of less than about 170 sccm/arc, and an oxygen flow rate less than about 950 sccm/arc. Preferably, for the first and second abrasion layers the arc current is in the range of about 30-45 Amps/arc and the reactive reagent flow rate is in the range of about 50-150 sccm/arc. The oxygen flow rate is preferably in the range of 0-400 sccm/arc and 700-950 sccm/arc for the deposition of the first and second abrasion resistant layers, respectively.

Plasma recipe A—For the bottom side 18 of the plastic panel 14, the preheat temperature set-point is at about 250° C. providing a surface temperature on the plastic panel of about 40-50° C. It is especially preferable that the first abrasion resistant layer 26 is then deposited using an arc current of about 34 Amps/arc, a reactive reagent (e.g., D4) flow of about 125 sccm/arc, and a first oxygen flow rate of about zero (e.g., near 0 sccm/arc). The deposition of the first abrasion resistant layer 26 is followed by the deposition of the second abrasion resistant layer 30 using an especially preferable arc current of about 37 Amps/arc, a reactive reagent flow of about 150 sccm/arc, and an oxygen flow of about 800 sccm/arc.

For the top side 16 of the plastic panel 14 (containing the weathering layer 20) the preheat temperature set-point is at about 400° C. providing a surface temperature on the plastic panel of about 50-60° C. The first abrasion resistant layer 24 is deposited using an especially preferable arc current of about 34 Amps/arc, a reactive reagent flow (e.g., D4) of about 125 sccm/arc, and an oxygen flow of about 50 sccm/arc. The deposition of the first abrasion resistant layer 24 is followed by the deposition of the second abrasion resistant layer 28 using an especially preferable arc current of about 37 Amps/arc, a reactive reagent flow of about 150 sccm/arc, and an oxygen flow of about 800 sccm/arc.

Plasma recipe B—For the bottom side 18 of the plastic panel 14, the preheat temperature set-point is at about 250° C. providing a surface temperature on the plastic panel of about 40-50° C. The first abrasion resistant layer 26 layer is deposited using an especially preferable arc current of about 31 Amps/arc, a reactive reagent flow (e.g., D4) of about 125 sccm/arc, and an oxygen flow of about 50 sccm/arc. The deposition of the first abrasion resistant layer 26 is followed by the deposition of second abrasion resistant layer 30 using an especially preferable arc current of about 37 Amps/arc, a reactive reagent flow of about 150 sccm/arc, and an oxygen flow of about 800 sccm/arc.

For the top side 16 of the plastic panel (containing the weathering layer 20), the preheat temperature set-point is at about 400° C. providing a surface temperature on the plastic panel of about 50-60° C. The first abrasion-resistant layer 24 is deposited using an especially preferable arc current of about 34 Amps/arc, a reactive reagent flow (e.g., D4) of about 125 sccm/arc, and an oxygen flow of about 50 sccm/arc. The deposition of the first abrasion resistant layer 24 is followed by the deposition of the second abrasion resistant layer 28 using an especially preferable arc current of about 37 Amps/arc, a reactive reagent flow of about 150 sccm/arc, and an oxygen flow of about 800 sccm/arc.

As stated previously, the first abrasion resistant layers 24, 26 may contain UV blocking or absorbing species. Various PECVD-deposited siloxane layers have been shown to form a UV absorbent layer, such as those shown in U.S. Pat. No. 6,110,544. For example, tetramethyldisiloxane (TMDSO) has a UV absorbance per micrometer coating thickness on the order of about 0.011 ABS/µm (at 300 nm wavelength), 0.008 ABS/µm (at 325 nm wavelength), and 0.0062 ABS/µm (at 350 nm wavelength), and octamethylcyclotetrasiloxane (D4) has a UV absorbance at a thickness of 5 µm on the order of about 0.0024 ABS/µm (at 300 nm wavelength), 0.0024 ABS/µm (at 325 nm wavelength), and 0.0014 ABS/µm (at 350 nm wavelength).

It is an unexpected and surprising result that some siloxane materials can form relatively high UV absorbing layers. For example, vinyl-D4 (tetravinyltetramethylcyclotetrasiloxane) has an UV absorbance per micrometer coating thickness on the order of about 0.14 ABS/μm (at 325 nm wavelength). Further, it is known that many PECVD coatings made with UV absorbing (UVA) molecules are not stable to UV exposure (U.S. Pat. No. 6,110,544) when used as a single layer abrasion-resistant layer.

The inventors have discovered that when used alone or mixed with a low UV absorbent reactive species as a primer or interlayer in a PECVD system, these highly absorbing UV materials are stable. The inventors have determined that the use of such reactive reagents in a PECVD process can form an adherent and weatherable primer that can provide significant protection to the underlying panel from UV radiation and other environmental factors.

Figure 3B:
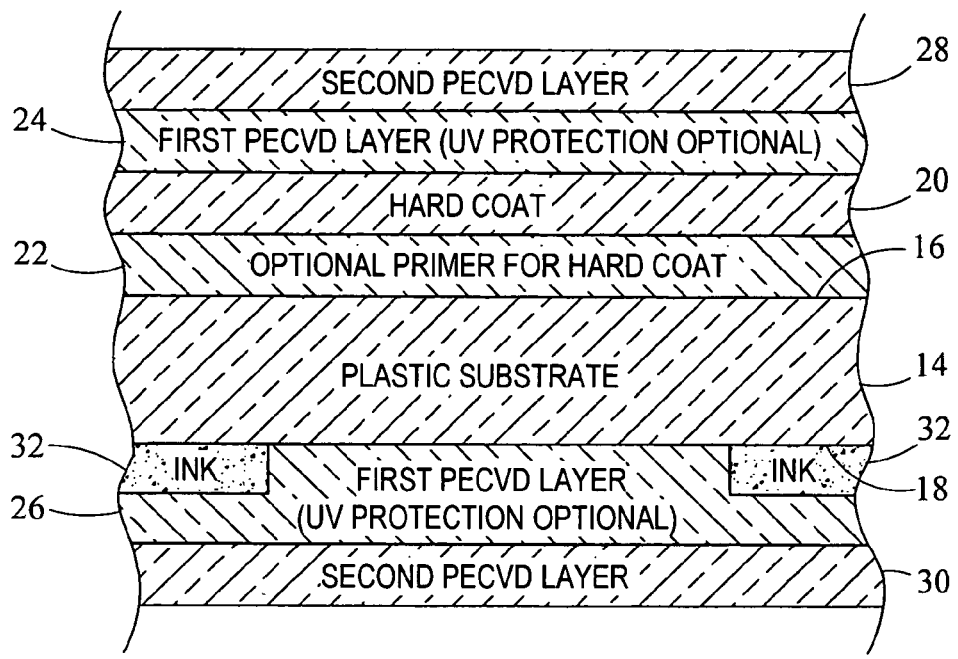
FIG. 3B is a cross sectional view, similar to FIG. 3A, of a portion of a glazing assembly having a decorative ink.

Referring to FIG. 3B, another embodiment of the glazing assembly 12 incorporating the principles of the invention is shown. This embodiment includes black-out ink 32 printed on the bottom side 18 of the plastic panel 16. Several inks that were found to work particularly well in this application were the thermal cured inks described in U.S. patent application Ser. No. 10/909,880 (filed on Aug. 2, 2004) which is hereby incorporated in its entirety by reference. These thermal cured inks include a polyester ink (8452, Nazdar, Kans.). In particular, 99-100% adhesion retention was observed after 9 days of water immersion at 65° C. for these particular inks on polycarbonate panels with arc-PECVD deposited abrasion resistant layers as detailed below.

For the bottom side 18 of the plastic panel 16 with the black out ink 32, the preheat temperature set-point of the heating unit is at about 250° C. providing a surface temperature on the plastic panel of about 50° C. The first abrasion resistant layer 26 is applied via arc-PECVD according to the following description for plasma recipe C. The second abrasion resistant layer 30 is then applied via arc-PECVD according to the following description for plasma recipe C. The inventors have found that the plasma recipe C exhibits exceptional performance not only when deposited upon ink 32, but also when deposited directly onto the plastic panel. In particular, 99-100% adhesion retention was observed after 9 days of water immersion at 65° C. for abrasion resistant layers deposited directly onto polycarbonate using plasma recipe C.

Plasma recipe C—For the bottom side 18 of the plastic panel 14 with the optional decorative printed ink 32, the preheat temperature set-point is at about 250° C. providing a surface temperature on the ink 32 of about 40-50° C. The first abrasion resistant layer 26 is deposited using an especially preferable arc current of about 3443 Amps/arc, a vinyl-D4 flow of about 20 sccm/arc, and an oxygen flow of about 0-300 sccm/arc. The deposition of the first abrasion resistant layer 26 is followed by the deposition of the second abrasion resistant layer 30 using an especially preferable arc current of about 34 Amps/arc, a reactive reagent flow (e.g., D4) of about 125 sccm/arc and an oxygen flow of about 800 sccm/arc.

Figure 3C:
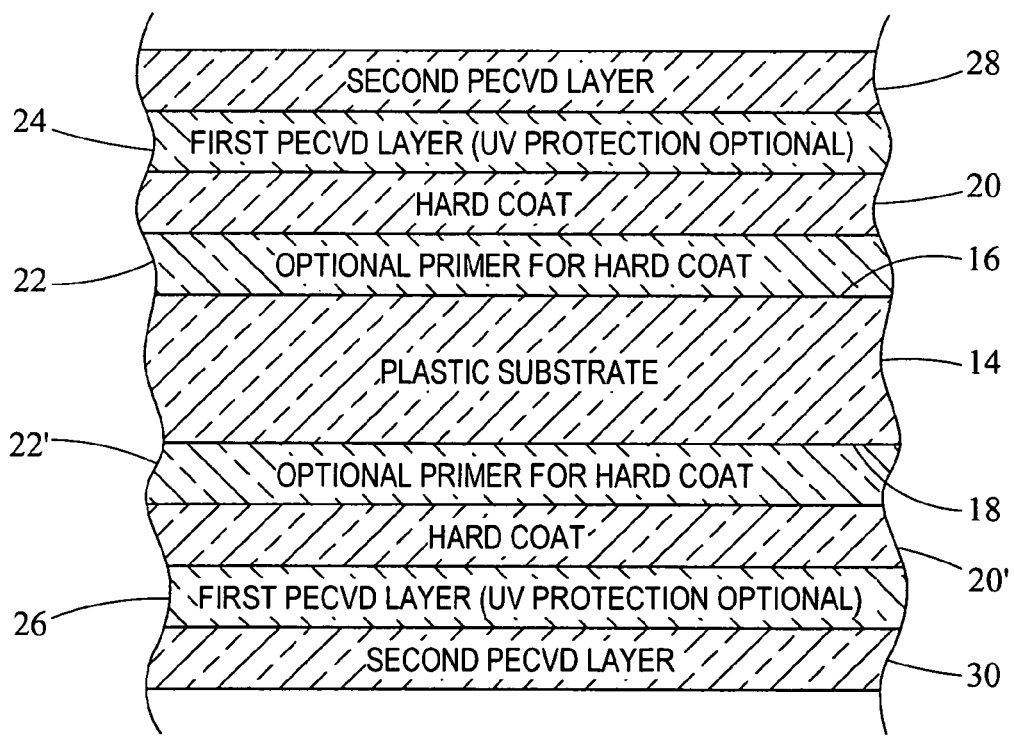
FIG. 3C is a cross sectional view, similar to FIG. 3A, of a portion of a glazing assembly having a weathering layer on both sides of the assembly.

Referring to FIG. 3C, another embodiment is shown. This embodiment is similar to the embodiment shown in FIG. 3A, however, a second weathering layer 20' with a second optional primer layer 22' is placed on the bottom side 18 of the plastic panel 14. The first and second abrasion resistant layers 26 and 30 covering the second weathering layer 20' are applied similarly to the first and second abrasion resistant layers 24, 28 applied to the weathering layer 20.

Preliminary validation test results obtained for panels comprising both plasma recipes (A and B) are provided in Tables 1-5. More specifically, Table 1 provides data obtained for both plasma recipes (A & B) on different polycarbonate panels with respect to adhesion retention. This test consists of submerging the coated panels in deionized water at 65° C. for 10 days with subsequent testing of adhesion via a cross-hatch, tape peel test (ASTM D3359-95, DIN 53151). A rating of >99B implies that greater than about 99% of the protective coating system remained adhered to the panel within the cross-hatch area. The B designation implies that very little coating delamination (B=less than about 2%) also occurred outside the cross-hatch area. In this test any delamination of the protective coating system in excess of 5% is considered a failure.

Table 2 provides data measured in regard to abrasion resistance using a Taber abrader protocol (ASTM D1044, DIN 52347) along with some accelerated weathering data using the Cira/sodalime test protocol. With respect to the Taber test results, a sample representing the bottom side of a coated glazing assembly is considered to pass the test, when the change in the percentage of haze measured at the surface of the sample (e.g., caused by the test) is less than about 10% after 500 cycles. Both plasma recipes are found to provide an abrasion-resistant layer that passes the test criteria. A sample representing the top side of a coated glazing assembly is considered to pass the Taber test, when the change in the percentage of haze measured at the surface of the sample (e.g., caused by the test) is about 2% or less after 1000 cycles. Both plasma recipes are found to provide an abrasion-resistant layer that passes the test criteria.

With respect to the accelerated weathering test using a Cira/sodalime weathering test, a sample representing the bottom side of the coated glazing assembly, where the presence of a weathering layer may be absent, should reach or exceed exposure to 0.20 MJ/m$^2$ of UV radiation before any delamination of the abrasion layer (and optional weathering layer) is encountered. Both plasma recipes are found to provide an abrasion layer that exceeds the test criteria by surviving exposure to 0.52 MJ/m$^2$ prior to any delamination.

TABLE 1

| | | Adhesion rating at day 10 | |
|---|---|---|---|
| Resin type | Number of replicates | Recipe A | Recipe B |
| Clear PC (General Electric) | 9 | >99B | >99B |
| Solar PC (General Electric) | 9 | >99B | >99B |
| Privacy PC (General Electric) | 9 | >99B | >99B |
| black PC (143R, General Electric) | 9 | >99B | >99B |
| Black PC (143, General Electric) | 9 | >99B | >99B |
| Solar PC (Bayer) | 9 | >99B | >99B |
| Privacy PC (Bayer) | 9 | >99B | >99B |
| Black PC (M2407, Bayer) | 9 | >99B | >99B |

TABLE 2

| | Taber Delta Haze | | | Cira/Sodalime weathering | | |
|---|---|---|---|---|---|---|
| | | Top | | | Top | |
| | Bottom Side, No WL (500 cycles) | Side, With WL (1000 cycles) | Sample population | Bottom Side, No WL | Side, With WL | Sample population |
| Recipe ID | | | | | | |
| Recipe A | 4.40% | 2.01% | 3 | 0.52 MJ/m2 | N/A | 3 |
| Recipe B | 6.21% | 2.13% | 3 | 0.52 MJ/m2 | N/A | 3 |

(WL = Weathering Layer)

Table 3 provides adhesion data obtained after thermal cycling using an automotive OEM test condition (PSA Peugot Citroen, D47-1309) consisting of 14 total cycles with each cycle consisting of exposing the test panel to a temperature of 40° C. and relative humidity 95% for 16 hours, a temperature of −20° C. for 3 hours, and a temperature of 85° C. at about 50-80% relative humidity conditions for 6 hours. Upon completion of the thermal cycling portion of the test a simple unscribed (no cross-hatch) tape-pull is used to determine the occurrence of coating delamination. A sample passes the test when less than about 5% of the coating is observed to delaminate. In other words, coating retention on the panel must be at least about 95% in order to pass this test.

Table 4 provides data obtained for the cohesive failure of a urethane adhesive bonded to coated panels comprising the two plasma recipes. More specifically, the test protocol utilized, entitled cataplasma testing, is well known to those skilled in the art of automotive adhesives. In cataplasma testing, a urethane adhesive bead is bonded to the test panel followed by exposure to heat, moisture, and thermal shock. The resulting bonding performance of the urethane adhesive is then determined upon pulling the bead away from the coated panel. Coating performance may also be evaluated via a concurrent cross-hatch adhesion test. The degree to which the observed adhesion failure reflects the cohesive failure of the urethane adhesive (e.g., adhesive bead breaks or splits) is then determined. The higher the cohesive failure rating (%), the better the overall system has performed. In Table 4, plasma recipe A is observed to perform better than plasma recipe B. Thus plasma recipe A is preferred over plasma recipe B. The performance of the glazing assembly derived from plasma recipe A exceeds the criteria specified by most automotive OEMs (original equipment manufacturers).

TABLE 3

|  | Sample Population | after Thermal Cycle (14 days) |
|---|---|---|
| Panels (ALL COATED WITH RECIPE A) | | |
| Clear PC (General Electric Optical Grade resin) | 1 | Pass |
| Clear PC (Bayer Optical Grade resin) | 8 | Pass |
| Solar PC (General Electric Optical Grade resin) | 1 | Pass |
| Solar PC (Bayer Optical Grade resin) | 1 | Pass |
| Privacy PC (General Electric Optaical Grade resin) | 1 | Pass |
| Privacy PC (Bayer Optical Grade resin) | 1 | Pass |
| Black PC (GE 143 resin) | 1 | Pass |
| Black PC (Bayer M2407 resin) | 1 | Pass |
| Black PC (GE 143R resin) | 1 | Pass |
| Substrates (ALL COATED WITH RECIPE A) | | |
| Clear PC (General Electric Optical Grade resin) | 1 | Pass |
| Clear PC (Bayer Optical Grade resin) | 8 | Pass |
| Solar PC (General Electric Optical Grade resin) | 1 | Pass |
| Solar PC (Bayer Optical Grade resin) | 1 | Pass |
| Privacy PC (General Electric Optaical Grade resin) | 1 | Pass |
| Privacy PC (Bayer Optical Grade resin) | 1 | Pass |
| Black PC (GE 143 resin) | 1 | Pass |
| Black PC (Bayer M2407 resin) | 1 | Pass |
| Black PC (GE 143R resin) | 1 | Pass |
| Panels (ALL COATED WITH RECIPE A) | | |
| Clear PC (General Electric Optical Grade resin) | 1 | Pass |
| Clear PC (Bayer Optical Grade resin) | 8 | Pass |
| Solar PC (General Electric Optical Grade resin) | 1 | Pass |
| Solar PC (Bayer Optical Grade resin) | 1 | Pass |
| Privacy PC (General Electric Optaical Grade resin) | 1 | Pass |
| Privacy PC (Bayer Optical Grade resin) | 1 | Pass |
| Black PC (GE 143 resin) | 1 | Pass |

TABLE 3-continued

|  | Sample Population | after Thermal Cycle (14 days) |
|---|---|---|
| Black PC (Bayer M2407 resin) | 1 | Pass |
| Black PC (GE 143R resin) | 1 | Pass |

TABLE 4

| Resin type | Number of replicates | Recipe A | Recipe B |
|---|---|---|---|
| GE Clear PC (Optical Grade) resin | 9 | >80% cohesive | 20-30% cohesive |
| GE solar PC (Optical Grade) resin | 9 | >80% cohesive | 20-30% cohesive |
| GE privacy PC (Optical Grade) resin | 9 | >80% cohesive | 20-30% cohesive |
| GE 143R PC resin | 9 | >80% cohesive | 20-30% cohesive |
| GE 143 PC resin | 9 | >80% cohesive | 20-30% cohesive |
| Bayer solar PC (Optical Grade) resin | 9 | >80% cohesive | 20-30% cohesive |
| Bayer privacy PC (Optical Grade) resin | 9 | >80% cohesive | 20-30% cohesive |
| Bayer M2407 PC resin | 7 | >80% cohesive | 20-30% cohesive |

Table 5 provides data obtained for the chemical resistance exhibited by the coatings deposited using the various plasma recipes. A pass rating for this test indicates that contact between the chemical and the coating system will have minimal impact on overall performance. Both plasma recipes A and B were found to pass exposure to the various chemicals listed in the table.

TABLE 5

| Chemicals | Sample Population | Recipe-A | Recipe-B |
|---|---|---|---|
| Oleic Acid | 3 | Pass | Pass |
| Kerosene | 3 | Pass | Pass |
| Gasoline | 3 | Pass | Pass |
| Simulated Windshield Washer Fluid | 3 | Pass | Pass |
| Reference Kerosene | 3 | Pass | Pass |
| Reference Petrol | 3 | Pass | Pass |
| Methylethyl alcohol | 3 | Pass | Pass |
| Toluene | 3 | Pass | Pass |

In as much as the foregoing disclosure is intended to enable one skilled in the pertinent art to practice the present invention, it should not be construed to be limited thereby, but should be construed to include such aforementioned obvious variations and be limited only by the spirit and scope of the following claims.

The invention claimed is:

1. A glazing assembly comprising:
a plastic panel having a first side surface and a second side surface;
a first protective coating system deposited on the first side surface, the first protective coating system further comprises a weathering layer and at least a first abrasion-resistant layer on the weathering layer and a second abrasion-resistant layer on the first abrasion-resistant layer;
a second protective coating system deposited on the second side surface, the second protective coating system further comprises a first abrasion resistant layer comprising a vinyl-D4 layer on the second side surface and a second abrasion-resistant layer on the first abrasion-resistant layer; and wherein the first and second protective coating systems each provide a different amount of protection from weathering and abrasion to the plastic panel from the first and second side surfaces, respectively;

wherein a weathering layer and a primer layer are not provided between the first abrasion-resistance layer of the second protective coating system and the second side surface;

wherein the abrasion resistant layers are vacuum deposited layers and the first abrasion-resistant layer of the second protective coating system includes a UV absorbing species formed from a reactive species;

wherein at least one of the abrasion resistant layers of the second protective coating system is different in composition from the abrasion resistant layers of the first protective coating system.

2. The glazing assembly of claim 1, wherein the weathering layer further comprises a multilayer coating having interlayers.

3. The glazing assembly of claim 2, wherein at least one of the interlayers contains UV absorbing molecules.

4. The glazing assembly of claim 2, wherein the multilayer coating interlayers comprise an acrylic primer and a silicone hard-coat.

5. The glazing assembly of claim 1, wherein the vacuum deposited layers are PECVD deposited layers.

6. The glazing assembly of claim 5, wherein the PECVD deposited layers are arc-PECVD deposited layers.

7. The glazing assembly of claim 1, wherein each of the abrasion resistant layers of the first and second protective coating systems is made from at least one of a-siloxane, a silicon oxy-carbide, and a hydrogenated silicon oxy-carbide.

8. The glazing assembly of claim 1 wherein one of the abrasion-resistant layers in the first protective system and one of the abrasion-resistant layers in the second protective system are of the same chemical composition.

9. The glazing assembly of claim 1, further comprising a decorative ink layer disposed between the plastic panel and the second protective coating system.

10. The glazing assembly of claim 1, wherein the plastic panel is constructed of a thermoplastic resin.

11. The glazing assembly of claim 10, wherein the thermoplastic resin is one of polycarbonate, acrylic, polyarylate, polyester, and polysulfone.

12. The glazing assembly according to claim 1, wherein the plastic panel is a transparent panel.

13. The glazing assembly of claim 1, wherein the first protective coating system comprises the first abrasion-resistant layer is disposed directly on the weathering layer and a second abrasion-resistant layer is disposed directly on the first abrasion-resistant layer; and wherein the second protective coating system comprises the first abrasion-resistant layer directly on the second side surface and a second abrasion-resistant layer directly on the first abrasion-resistant layer.

14. The glazing assembly of claim 1, wherein the second abrasion-resistant layer of the second protective coating system comprises D4.

15. A glazing assembly comprising:
a plastic panel having a first side surface and a second side surface;
a first protective coating system deposited on the first side surface, the first protective coating system further comprises a weathering layer and at least a first abrasion-resistant layer on the weathering layer and a second abrasion-resistant layer on the first abrasion-resistant layer;
a second protective coating system deposited on the second side surface, the second protective coating system further comprises a first abrasion resistant layer comprising a vinyl D4 layer directly on the second side surface and a second abrasion-resistant layer on the first abrasion-resistant layer; and
wherein the abrasion resistant layers are vacuum deposited layers and the first abrasion-resistant layer of the second protective coating system includes a UV absorbing species formed from a reactive species;
wherein at least one of the abrasion resistant layers of the second protective coating system is different in composition from the abrasion resistant layers of the first protective coating system.

* * * * *